United States Patent
Logsdon et al.

(10) Patent No.: US 6,844,606 B2
(45) Date of Patent: Jan. 18, 2005

(54) SURFACE-MOUNT PACKAGE FOR AN OPTICAL SENSING DEVICE AND METHOD OF MANUFACTURE

(75) Inventors: James H. Logsdon, Kokomo, IN (US); Abhijeet V. Chavan, Carmel, IN (US); Hamid R. Borzabadi, Noblesville, IN (US)

(73) Assignee: Delphi Technologies, Inc., Troy, MI (US)

( * ) Notice: Subject to any disclaimer, the term of this patent is extended or adjusted under 35 U.S.C. 154(b) by 39 days.

(21) Appl. No.: 10/065,446

(22) Filed: Oct. 18, 2002

(65) Prior Publication Data

US 2003/0146384 A1 Aug. 7, 2003

Related U.S. Application Data

(60) Provisional application No. 60/354,555, filed on Feb. 4, 2002.

(51) Int. Cl.[7] .............................................. H01L 23/02
(52) U.S. Cl. ...................... 257/434; 257/432; 257/680; 257/703; 257/704; 250/338.1; 250/338.4
(58) Field of Search ................................ 257/432, 433, 257/434, 436, 680, 703, 704, 710, 723; 250/338.1, 338.4

(56) References Cited

U.S. PATENT DOCUMENTS

| | | | |
|---|---|---|---|
| 5,895,233 A | | 4/1999 | Higashi et al. ............. 438/107 |
| 6,384,473 B1 | * | 5/2002 | Peterson et al. ............ 257/680 |
| 6,603,183 B1 | * | 8/2003 | Hoffman ..................... 257/434 |
| 6,686,653 B2 | * | 2/2004 | Jerominek et al. .......... 257/680 |
| 2002/0023765 A1 | * | 2/2002 | Sugiura et al. ............. 174/52.2 |

* cited by examiner

*Primary Examiner*—Minhloan Tran
*Assistant Examiner*—Thomas L Dickey
(74) *Attorney, Agent, or Firm*—Stefan V. Chmielewski

(57) ABSTRACT

An optical sensor package capable of being surface mounted, and in a form that enables multiple packages to be fabricated simultaneously and then array tested in a wafer stack prior to singulation. The package comprises a chip carrier, a device chip electrically and mechanically connected to a first surface of the chip carrier with solder connections, and a capping chip secured to the chip carrier to hermetically enclose the device chip. The device chip has an optical sensing element on a surface thereof, while the capping chip has means for enabling radiation to pass therethrough to the device chip. The chip carrier includes conductive vias that are electrically connected to the solder connections of the device chip and extend through the chip carrier to bond pads on a second surface of the chip carrier, enabling the package to be surface mounted with solder connections to a suitable substrate.

13 Claims, 1 Drawing Sheet

SURFACE-MOUNT PACKAGE FOR AN OPTICAL SENSING DEVICE AND METHOD OF MANUFACTURE

CROSS REFERENCE TO RELATED APPLICATIONS

This application claims the benefit of U.S. Provisional Application No. 60/354,555, filed Feb. 4, 2002.

BACKGROUND OF INVENTION

1. Field of the Invention

The present invention generally relates to packaging of optical sensors. More particularly, this invention relates to a package containing an optical sensing chip and capable of being surface mounted to a circuit board to provide electrical connection between the sensing chip and conductors on the circuit board.

2. Description of the Related Art

A variety of optical sensors are known that employ a radiation-sensing element, such as a thermopile, fabricated in or on the surface of a silicon chip (referred to herein as a sensing chip). The sensing chip is often placed within a protective package, such as a TO-x type can, with a window that allows radiation to reach the sensing element. The sensing chip is then wirebonded to electrically connect the sensing element to bond pads on the package, which in turn must then be mounted to a circuit board in a manner that electrically and physically interconnects the sensing element to the board circuitry. A drawback of this type of packaging approach is that each sensing chip and package must be individually handled and tested, and the packages are not suitable for surface mounting.

An alternative packaging approach is disclosed in U.S. Pat. No. 5,895,233 to Higashi et al., in which micropackages for infrared devices are fabricated by forming multiple infrared devices and associated bond pads in the surface of a sensing wafer, solder bonding an infrared-transparent capping wafer to the sensing wafer to enclose each of the infrared devices and leave their bond pads accessible, and then singulating the wafer assembly to produce individual packages, each containing an infrared device and each equipped with wirebond pads. Cavities are defined between the capping and sensing wafers to receive and/or provide clearance for each infrared device. The wafers can be assembled in a vacuum so that the cavities containing the infrared devices are evacuated and hermetically sealed.

Though the multiple micropackages of Higashi et al. can be array tested prior to singulation, the packages are not suitable for surface mounting.

SUMMARY OF INVENTION

The present invention provides an optical sensor package capable of being surface mounted, and in a form that enables multiple packages to be formed simultaneously and then array tested in a wafer stack prior to singulation.

Generally, the optical sensor package comprises a chip carrier, a device chip electrically and mechanically connected with solder connections to a first surface of the chip carrier, and a capping chip secured to the chip carrier to hermetically enclose the device chip. The device chip has an optical sensing element on a surface thereof, while the capping chip has means for enabling radiation to pass through the capping chip to the device chip. The chip carrier includes conductive vias that are electrically connected to the solder connections of the device chip and extend through the chip carrier to bond pads on a second surface of the chip carrier, enabling the package to be surface mounted with solder connections to a suitable substrate, such as a circuit board.

A method of fabricating the optical sensor package described above includes forming the chip carrier to contain the conductive vias, preferably through the use of a low temperature co-fired ceramic (LTCC) material and process. The device chip is then secured with solder connections to the chip carrier to electrically connect the device chip to the conductive vias of the chip carrier, and then the capping chip is secured to the chip carrier to hermetically enclose the device chip. Thereafter, the package can be surface mounted to a suitable substrate, such as by reflowing solder bumps formed on the bond pads of the package or on the substrate.

As described above, a plurality of the packages can be simultaneously fabricated by defining a plurality of chip carriers in a chip carrier wafer, preferably formed of an LTCC material, and defining a plurality of capping chips in a capping chip wafer. After placement of the device chips on the chip carriers of the chip carrier wafer, the carrier and capping wafers can be bonded together before singulation to form the individual packages. As such, an optical sensor package of this invention has the ability to be array tested with other packages formed simultaneously in the same wafer, significantly reducing test time. In addition, the bonded wafers and the singulated packages can be handled with minimal risk of damage to the sensing element and any signal conditioning circuitry on the device chips. The ability to surface mount the packages further reduces mounting costs and time, and also provides increased reliability. Finally, the hermetically-sealed package minimizes and stabilizes undesirable heat loss from the sensing element, thus improving sensitivity and reducing long term drift.

Other objects and advantages of this invention will be better appreciated from the following detailed description.

DETAILED DESCRIPTION

Figure 1:
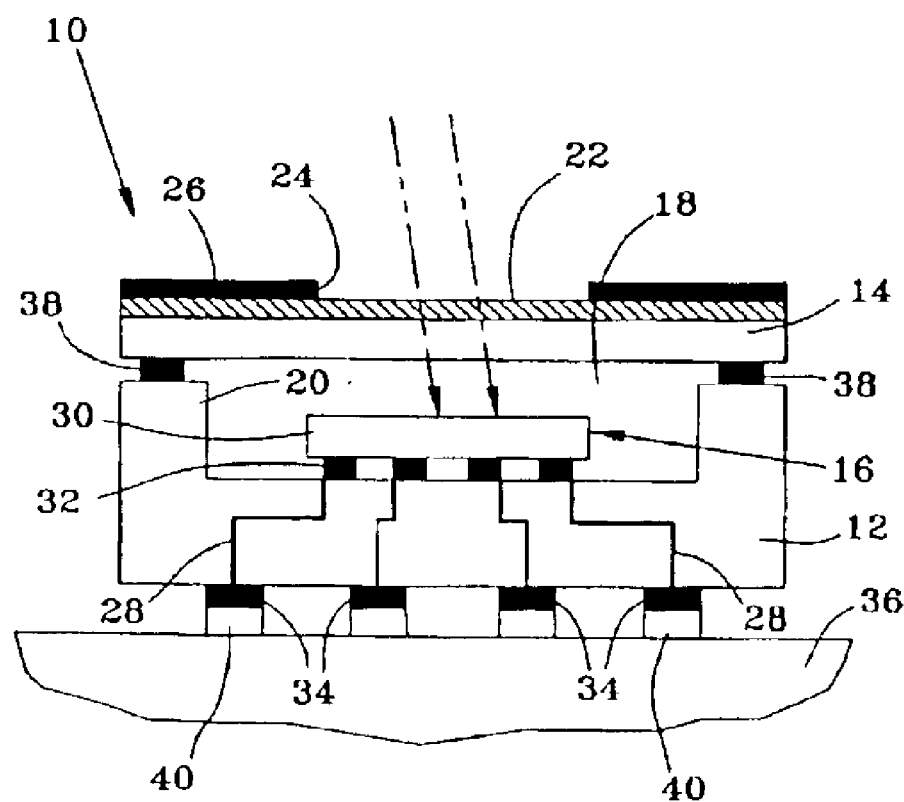
FIG. 1 represents a cross-section of an optical sensor package in accordance with a preferred embodiment of the invention.

FIG. 1 represents an optical sensor package 10 that can be fabricated and surface mounted in accordance with this invention. The package 10 is shown as being formed by solder bonding a device chip carrier 12 to a capping chip 14, such that an optical sensing device chip 16 is enclosed and protected within a cavity 18 defined by and between the capping chip 14 and the device chip carrier 12, e.g., the cavity 18 is formed by a recess 20 in the device chip carrier 12. While shown as being a stack of an individual capping chip 14 and chip carrier 12, the invention preferably entails the use of wafers that are bonded together and later singulated to form any desired number of packages 10 of the type shown in FIG. 1. With this approach, a device chip carrier wafer is processed to have an array of recesses 20, each of which will form a cavity 18 with a capping wafer to contain an optical sensing device chip 16.

The capping chip 14 is preferably silicon, more preferably monocrystallographic silicon, though it is foreseeable that other materials that exhibit low absorption to infrared radiation could be used. As seen in FIG. 1, the capping chip 14 has an antireflection coating 22 exposed within an aperture 24 that has been defined in an outer coating 26 on the chip 14. The antireflection coating 22 serves to minimize the amount of infrared radiation reflected by the capping chip 14 through which the infrared radiation must pass to reach the device chip 16. The outer coating 26 is preferable opaque to the desired range of infrared radiation wavelengths so that the desired wavelengths impinge the desired location on the device chip 16 (e.g., corresponding to the location of the sensing elements on the chip 16), but are otherwise reflected to minimize thermal energy absorption by the package 10. Alternatively or in addition, an antireflection coating could be present on the interior surface of the capping chip 14. Suitable materials for the antireflection coating 22 include a single layer of silicon nitride, composite layers of ZnS and Ge, organic layers, and other custom composite layers of appropriate materials at appropriate thicknesses to meet the required radiation spectrum sensing regime.

The device chip carrier 12 is preferably formed of low temperature co-fired ceramic (LTCC), though essentially any technology capable of providing low-resistance electrical paths (e.g., metal vias 28, discussed below) through the chip carrier 12 could be used. A preferred LTCC material is referred to as 951 Low-Temperature Cofire Dielectric Tape, available from DuPont, though other LTCC materials could be used. An advantage of forming the chip carrier 12 of an LTCC material is that the vias 28 and recess 20 in the device chip carrier 12 can be fabricated during the green tape portion of LTCC fabrication and then fired. A suitable process for forming the vias 28 in an LTCC material involves a screen printing technique well known in the art, and therefore will not be described here in any detail. Alternatively, the vias 28 and recess 20 would require being formed by machining, etching and/or additional process steps if another material for the device chip carrier 12 is used.

The optical sensing device chip 16 is represented as being a flip chip comprising a semiconductor substrate 30. An optical sensing element (not shown) is located on the upper surface of the chip 16, and can have a variety of transduction configurations. In a preferred embodiment, the sensing element is an infrared-sensing thermopile configured and fabricated in accordance with U.S. patent application Ser. Nos. 10/065,447 and 10/065,448 incorporated herein by reference. Signal conditioning circuitry (not shown) for the optical sensing element can be formed on the chip 16, though it is foreseeable that the circuitry could be formed on a separate signal conditioning chip that is electrically connected to the sensing device chip 16 through the device chip carrier 12.

The sensing device chip 16 is shown electrically connected with solder connections 32 to bond pads (not shown) on the recessed surface of the device chip carrier 12, which in turn are electrically interconnected with bond pads 34 on the lower surface of the device chip carrier 12 by metal vias 28. As discussed above, the metal vias 28 are preferably formed by screen printing during the green tape portion of LTCC fabrication of the device chip carrier 12, though other suitable methods could be used. With the bond pads 34, the sensing element on the sensing device chip 16 (and its signal conditioning circuitry) can be electrically interconnected with circuitry on a substrate, e.g., a circuit board 36, to which the package 10 is mounted by known surface mount methods, including solder connections 40 formed by known solder bumping and reflow techniques as represented in FIG. 1.

In a preferred embodiment of the invention, the capping chip 14 is attached to the device chip carrier 12 with a solder seal ring 38 that surrounds the cavity 18, though it is foreseeable that glass frit or another bonding technique could be employed that is capable of providing hermetic sealing. Also in the preferred embodiment, the sensing device chip 16 is first reflow soldered to the chip carrier 12, after which the capping chip 14 and chip carrier 12 are solder bonded using a solder alloy for the ring 38 that has a lower reflow temperature than the solder alloy used for the solder connections 32 between the sensing device chip 16 and chip carrier 12. For example, the solder connections 32 may be formed of 90Pb-10Sn, typically reflowed at peak temperatures of about 310° C. to about 330° C., while the solder ring 38 may be 70Pb-30Sn, typically reflowed at peak temperatures of about 260° C. to about 280° C. The lower reflow temperature solder alloy can be deposited on either of a pair of complementary solderable metal rings on the capping chip 14 or the chip carrier 12. Solder bonding of the chip 14 and chip carrier 12 with the seal ring 38 is preferably performed in a vacuum, with the result that the sensing device chip 16 is hermetically vacuum sealed within the cavity 18 to enhance the performance of the sensing element.

After assembly, the sensor device chip 16 within the package 10 is functionally tested. In the preferred embodiment in which multiple packages 10 are simultaneously formed with a pair of bonded capping and device carrier wafers, all of the sensor devices 16 within the packages 10 are array tested, followed by singulation of the bonded wafers to form multiple packages 10 of the type shown in FIG. 1. Each package 10 that successfully passes testing is then placed and reflow soldered to the surface of a substrate, e.g., the circuit board 36 in FIG. 1, using a solder whose melting temperature is less than that of the solders used to form the solder connections 32 and the solder seal ring 38. For example, the solder connections 40 attaching the package 10 to the circuit board 36 may be 63Sn-37Pb, typically reflowed at peak temperatures of about 210° C. to about 230° C.

While the invention has been described in terms of a specific embodiment, it is apparent that other forms could be adopted by one skilled in the art. For example, various processing parameters could be used, the sensor package 10 could differ in appearance and construction from the embodiment shown in FIG. 1, and appropriate materials could be substituted for those noted. Accordingly, the scope of the invention is to be limited only by the following claims.

What is claimed is:

1. An optical sensor package comprising:
    a chip carrier;
    a device chip electrically and mechanically connected to a first surface of the chip carrier with solder connections, the device chip having an optical sensing element on a surface thereof;
    a capping chip secured to the chip carrier with a solder joint to hermetically enclose the device chip, the solder joint having a lower melting temperature than the solder connections, the capping chip having means for enabling radiation to pass through the capping chip to the device chip;
    conductive vias electrically connected to the solder connections of the device chip, the conductive vias extending through the chip carrier from the first surface thereof to a second surface thereof; and
    bond pads on the second surface of the chip carrier and electrically connected to the conductive vias.

2. The optical sensor package according to claim 1, wherein the chip carrier is formed of a low-temperature co-fired ceramic material.

3. The optical sensor package according to claim 1, wherein the device chip is received in a recess formed in the chip carrier.

4. The optical sensor package according to claim 1, further comprising a substrate having conductors on a surface thereof, and second solder connections securing the package to the substrate and electrically and mechanically connecting the bond pads on the second surface of the chip carrier to the conductors on the substrate.

5. The optical sensor package according to claim 1, wherein the chip carrier is one of a plurality of chip carriers defined by a chip carrier wafer, the capping chip is one of a plurality of capping chips defined by a capping chip wafer, and the device chip is one of a plurality of device chips enclosed between the chip carrier wafer and the capping chip wafer.

6. An optical sensor package comprising:
   a chip carrier;
   a device chip electrically and mechanically connected to a first surface of the chip carrier with solder connections, the device chip having an optical sensing element on a surface thereof;
   a capping chip secured to the chip carrier to hermetically enclose the device chip, the capping chip having means for enabling radiation to pass through the capping chip to the device chip, wherein the means for enabling radiation to pass through the capping chip comprises a monocrystallographic silicon portion of the capping chip;
   conductive vias electrically connected to the solder connections of the device chip, the conductive vias extending through the chip carrier from the first surface thereof to a second surface thereof; and
   bond pads on the second surface of the chip carrier and electrically connected to the conductive vias.

7. The optical sensor package according to claim 6, wherein the means for enabling radiation to pass through the capping chip further comprises an antireflection coating on a surface of the capping chip and overlying the monocrystallographic silicon portion thereof, the antireflection coating minimizing reflection of a range of radiation wavelengths by the capping chip.

8. The optical sensor package according to claim 6, wherein the means for enabling radiation to pass through the capping chip further comprises a coating on a surface of the capping chip, the coating being substantially opaque to a range of radiation wavelengths and having an opening aligned with the monocrystallographic silicon portion of the capping chip and the optical sensing element on the device chip.

9. An infrared sensor package comprising:
   a chip carrier formed of a low-temperature co-fired ceramic material, the chip carrier having a first surface, an oppositely-disposed second surface, conductive vias extending through the chip carrier between the first and second surfaces thereof, and bond pads on the second surface and electrically connected to the conductive vias;
   a device chip flip-chip mounted to the first surface of the chip carrier with first solder connections electrically connected to the conductive vias of the chip carrier, the device chip having an infrared sensing element on a surface thereof; and
   a capping chip secured with a solder ring to the chip carrier to hermetically enclose the device chip within a cavity defined between the chip carrier and the capping chip, the capping chip being formed of monocrystallographic silicon so as to enable infrared radiation to pass through a wall poilion of the capping chip to the infrared sensing element on the device chip, the solder ring having a lower melting temperature than the first solder connections.

10. The infrared sensor package according to claim 9, further comprising an antireflection coating on a surface of the capping chip and overlying the wall portion thereof, the antireflection coating minimizing reflection of infrared radiation by the capping chip.

11. The infrared sensor package according to claim 9, further comprising a coating on a surface of the capping chip, the coating being substantially opaque to infrared radiation and having an opening aligned with the wall portion of the capping chip and the infrared sensing element on the device chip.

12. The infrared sensor package according to claim 9, further comprising a substrate having conductors on a surface thereof, and second solder connections securing the package to the substrate and electrically and mechanically connecting the bond pads on the second surface of the chip carrier to the conductors on the substrate, the second solder connections having a lower melting temperature than the first solder connections and the solder ring.

13. The infrared sensor package according to claim 9, wherein the chip carrier is one of a plurality of chip carriers defined by a chip carrier wafer formed of the low-temperature co-fired ceramic material, the capping chip is one of a plurality of capping chips defined by a capping chip wafer formed of monocrystallographic silicon, and the device chip is one of a plurality of device chips enclosed between the chip carrier wafer and the capping chip wafer.

* * * * *